United States Patent [19]

Sanders et al.

[11] Patent Number: 5,212,040
[45] Date of Patent: May 18, 1993

[54] CARBONLESS PAPER FOR ELECTROSTATIC IMAGING PROCESSES

[75] Inventors: David J. Sanders, Oakville; John F. Oliver; Marcel P. Breton, both of Mississauga, all of Canada

[73] Assignee: Xerox Corporation, Stamford, Conn.

[21] Appl. No.: 806,508

[22] Filed: Dec. 13, 1991

[51] Int. Cl.$^5$ .................................. G03G 13/14
[52] U.S. Cl. ..................... 430/126; 430/138
[58] Field of Search ............... 430/106, 106.6, 109, 430/138, 126

[56] References Cited

U.S. PATENT DOCUMENTS

| | | | |
|---|---|---|---|
| 4,399,209 | 8/1983 | Sanders et al. | 430/138 |
| 4,440,846 | 4/1984 | Sanders et al. | 430/138 |
| 4,508,807 | 4/1985 | Adair | 430/138 |
| 4,587,194 | 5/1986 | Adair et al. | 430/138 |
| 4,742,374 | 5/1988 | Yamamoto et al. | 355/27 |
| 4,766,037 | 8/1988 | Wantanbe et al. | 428/402.21 |
| 4,782,003 | 11/1988 | Yoshihara | 430/138 |
| 4,788,125 | 11/1988 | Davis et al. | 430/128 |
| 4,873,219 | 10/1989 | Brown et al. | 503/204 |
| 5,082,757 | 1/1992 | Keoshkerian et al. | 430/126 |

*Primary Examiner*—John Goodrow
*Attorney, Agent, or Firm*—Judith L. Byorick

[57] ABSTRACT

Disclosed is a process which comprises incorporating into an electrostatic imaging apparatus a recording sheet comprising a support on one surface of which are situated microcapsules which comprise a shell and a core containing a color former and an oil, said microcapsules being strengthened with polymer capable of degrading upon exposure to actinic radiation; generating an electrostatic latent image on an imaging member in the apparatus; developing the latent image with a developer; transferring the developed image to the recording sheet; and, subsequent to transfer and fusing, exposing the recording sheet to actinic radiation at a wavelength at which the polymer will degrade, thereby rendering the microcapsules subject to rupture upon application of pressure. The process enables the use of carbonless papers in electrostatic imaging apparatuses while preventing premature rupture of the color former microcapsules by pressure exerted within the apparatus and reduces or eliminates contamination of the apparatus as a result of ruptured color former microcapsules.

40 Claims, No Drawings

CARBONLESS PAPER FOR ELECTROSTATIC IMAGING PROCESSES

BACKGROUND OF THE INVENTION

The present invention is directed to carbonless paper which can be employed in electrostatic imaging processes such as electrophotography, ionography, and the like. More specifically, in one embodiment the present invention is directed to a process which comprises incorporating into an electrostatic imaging apparatus a recording sheet comprising a support on one surface of which are situated microcapsules which comprise a shell and a core containing a color former and an oil, said microcapsules being strengthened with a polymer capable of degrading upon exposure to actinic radiation; generating an electrostatic latent image on an imaging member in the apparatus; developing the latent image with a developer; transferring the developed image to the recording sheet; and, subsequent to transfer, exposing the recording sheet to actinic radiation at a wavelength at which the polymer will degrade, thereby rendering the microcapsules subject to rupture upon application of pressure.

Carbonless paper sets generally are stacks of at least two sheets of paper wherein the application of pressure in imagewise fashion on the top sheet, typically by handwriting or typing, results in formation of a corresponding image on the underlying sheets, so that copies are formed as the image is generated on the top sheet. Carbonless paper sets typically comprise a top sheet of paper, on the bottom surface of which is coated a first composition, and a bottom sheet, on the top surface of which is coated a second composition. The first and second compositions are in contact with each other when the top and bottom sheets are placed in stack formation, and generally are of a nature such that application of pressure to the top sheet of the stack at a specified location causes interaction between the first and second compositions that results in the formation of a colored area on the bottom sheet at the location at which pressure was applied. Intermediate sheets can be located between the top and bottom sheets, wherein each intermediate sheet is coated on its top surface with the second composition and on its bottom surface with the first composition; application of pressure to the top sheet then results in the formation of a colored area at the location at which pressure was applied on each of the intermediate sheets and on the bottom sheet.

An example of a carbonless paper set is disclosed in U.S. Pat. No. 3,843,383, the disclosure of which is totally incorporated herein by reference. This patent discloses a recording sheet comprising a support having thereon a layer of color developer capable of reacting with a substantially colorless color former to form colored images. The paper set generally comprises a top sheet coated with microcapsules containing a color former solution, a bottom sheet coated with a color developer material in a binder, and, in some instances, middle sheets coated on one side with the color developer and on the other side with the color former microcapsules. Contacting a top sheet coated with color former containing microcapsules on its bottom surface with a bottom sheet coated on its top surface with a color developer and applying pressure to the paper "sandwich" thus formed results in formation of a color image. Other patents disclosing carbonless paper of this type include U.S. Pat. Nos. 2,712,507 and 2,730,456, the disclosures of which are totally incorporated herein by reference. Alternatively, as disclosed in U.S. Pat. No. 2,730,457, the disclosure of which is totally incorporated herein by reference, the color former microcapsules and the color developer of a carbonless paper can be applied to the same surface of a paper sheet. Other configurations of color former, color developer, and a pressure-releasable liquid solvent are possible, including, for example, those disclosed in U.S. Pat. No. 3,672,935, the disclosure of which is totally incorporated herein by reference. Additional patents disclosing carbonless papers and materials suitable for carbonless paper applications include U.S. Pat. Nos. 2,417,897, 3,672,935, 3,681,390, 4,202,820, 4,675,706, 3,481,759, 4,334,015, 4,372,582, 4,334,015, 2,800,457, 2,800,458, 3,418,250, 3,516,941, 4,630,079, 3,244,550, 3,672,935, 3,732,120, 3,843,383, 3,934,070, 3,481,759, 3,809,668, 4,877,767, 4,857,406, 4,853,364, 4,842,981, 4,842,976, 4,788,125, 4,772,532, and 4,710,570, the disclosures of each of which are totally incorporated herein by reference.

In some instances, users of carbonless papers may wish to pass the papers through mechanical devices that include automated paper handling systems. Such devices include printers, copiers, and duplicators for imprinting information on the carbonless sheets, as well as automatic sorting devices such as magnetic card readers and Optical Character Recognition devices for reading coded information from the carbonless sheets. All such devices contain pressure nips, including, for example, those between elements of the paper transport system such as feed belts and wheels, retard rollers, pinch rollers, and the like. When carbonless paper is passed through these devices, these elements come into contact with the surfaces of the carbonless sheets, and often become contaminated with components of the carbonless color forming coating, color developer coating, or both, which may produce a deleterious effect on the continued operation of the device. In particular, the microcapsules of the carbonless color former layer can become ruptured in a pressure nip, causing the color former solution to be deposited on one or both elements of the nip. This material may interact with other components of the carbonless coatings, or with components of other throughput materials, causing contamination and failure of the device.

For example, it may be desirable to generate images on carbonless paper sets in electrophotographic copiers and duplicators. The formation and development of images on the surface of photoconductive materials by electrostatic means is well known. The basic electrophotographic imaging process, as taught by C. F. Carlson in U.S. Pat. No. 2,297,691, entails placing a uniform electrostatic charge on a photoconductive insulating layer known as a photoconductor or photoreceptor, exposing the photoreceptor to a light and shadow image to dissipate the charge on the areas of the photoreceptor exposed to the light, and developing the resulting electrostatic latent image by depositing on the image a finely divided electroscopic material known as toner. The toner will normally be attracted to those areas of the photoreceptor which retain a charge, thereby forming a toner image corresponding to the electrostatic latent image. This developed image may then be transferred to a substrate such as paper. The transferred image may subsequently be permanently affixed to the substrate by heat, pressure, a combination of heat and pressure, or other suitable fixing means such as solvent or overcoating treatment. Other methods for forming latent images are also known, such as ionographic methods. In ionographic imaging processes, a latent image is formed on a dielectric image receptor or electroreceptor by ion deposition, as described, for example, in U.S. Pat. Nos. 3,564,556, 3,611,419, 4,240,084, 4,569,584, 2,919,171, 4,524,371, 4,619,515, 4,463,363, 4,254,424, 4,538,163, 4,409,604, 4,408,214, 4,365,549, 4,267,556, 4,160,257, and 4,155,093, the disclosures of each of which are totally incorporated herein by reference. Generally, the process entails application of charge in an image pattern with an ionographic writing head to a dielectric receiver that retains the charged image. The image is subsequently developed with a developer capable of developing charge images.

In electrostatic imaging devices, each sheet of paper in a stack is fed sequentially into the imaging apparatus, wherein an electrostatic latent image of one polarity is formed on an imaging member. The image is then developed with a toner charged to a polarity opposite to that of the latent image, and the developed image is transferred to the paper. Transfer is frequently effected by applying an electric charge of the same polarity as the latent image (and opposite to the polarity on the toner particles) to the back of the paper sheet. The charge applied to the back of the sheet is of greater magnitude than the charge of the latent image, which results in the toner particles becoming attracted to the paper and thus transferred from the imaging member to the paper. The charge may be applied in a non-contact manner by an ion deposition device, such as a corotron, scorotron, or similar device, or by contacting the back of the sheet by a charged roller conventionally known as a bias transfer roller. When a bias transfer roller is used, the paper passes through a nip formed between the imaging member and the bias transfer roller. After transfer to the paper, the image is generally fused to the paper by conventional methods, such as application of heat, pressure, or the like. Subsequent to fusing, the stack is reassembled so that the sheets are in their proper sequence in the stack.

When carbonless paper sets are passed through copiers and duplicators, frequently a problem arises with contamination of the imaging member with tackified clusters of toner. As the carbonless paper sheets pass through the imaging device, portions of the color former composition coating the paper sheets become transferred onto the imaging member, either as a result of direct contact between the imaging member and the coated paper, or indirectly as a result of contact between the coated paper and the bias transfer roll and subsequent contact between the bias transfer roll and the imaging member, which are in intimate contact prior to and subsequent to the passage of a sheet between them. Toner particles then accumulate on areas of the imaging member where portions of the coating composition are located and become tackified, thus contaminating the imaging member. Similar difficulties with contamination can occur at other pressure nips in an imaging device, such as that formed by contact between paper feeding components, or that formed by two fuser rolls. Similar contamination problems can also occur at pressure nips in other mechanical devices with automated paper handling systems.

A potential solution to the problem of contamination of imaging devices by carbonless papers might be to provide stronger color former microcapsules that will not be broken during transport of the carbonless sheet through a duplicator. Strengthening the microcapsule walls, however, adversely affects the pressure sensitivity of the paper set, so that when pressure is applied in imagewise fashion to the top sheet, the resulting images on bottom sheets exhibit reduced image contrast. Further, strengthening microcapsule walls to a degree that still enables formation of images by application of pressure generally will somewhat reduce but not substantially reduce or eliminate machine contamination; substantial reduction or elimination of machine contamination by strengthening the color former microcapsules could require that the capsules be strengthened to a degree that any attempt to form images by application of pressure to the top sheet of the set would result in images with little contrast density or no images at all on the lower sheets.

The present invention reduces or eliminates these problems by providing carbonless paper with reversibly strengthened microcapsules containing a color former. The color former microcapsules are resistant to rupture when the carbonless paper is passed through an electrostatic imaging device, thereby reducing or eliminating contamination of the device from capsule rupture. Subsequent to passing through the electrostatic imaging device, the carbonless paper is exposed to irradiation to soften the color former microcapsules so that images with acceptable contrast density can then be formed by applying pressure to the top sheet of the set. The present invention exhibits the additional advantage of reducing or eliminating smudges of developed carbonless color caused by pressure exerted on a collated carbonless paper stack by paper feeding mechanisms such as input feeders. Since the color former microcapsules are not sensitized to pressure until after the paper has passed through the imaging apparatus, pressure exerted on the paper stack does not cause unwanted smudges on the color developer coating of the carbonless paper.

Microcapsules with shells that vary in hardness depending on exposure to radiation are known. For example, U.S. Pat. No. 4,766,037 (Watanabe et al.), the disclosure of which is totally incorporated herein by reference, discloses a photodegradable microcapsule which has a wall made of a polymer coat having an acid-decomposable bond selected from a silylether bond and a silylureido bond and which contains a compound that generates an acid upon light irradiation. The microcapsule wall changes upon irradiation by light, bringing about one of the following effects: the confined core material can be readily recovered after irradiation by light; the wall being irradiated ruptures under a very small pressure; the core becomes readily releasable upon application of heat; a liquid component around the capsule can permeate into the capsule through the wall by irradiation; or an external molten composition can readily enter into the capsule upon application of heat.

In addition, U.S. Pat. No. 4,788,125 (Davis et al.), the disclosure of which is totally incorporated herein by reference, discloses an imaging material comprising a support and a layer of photosensitive microparticles on one surface of the support, the microparticles including an image forming agent and a photosensitive composition containing a polymer which is capable of undergoing cationically initiated depolymerization and a photoinitiator including a silver halide and an organo silver salt, wherein after exposing the microparticle to radiation, the microparticles, directly or with additional processing, release the image forming agent or become permeable to a developer which reacts with the image forming agent to form a visible image. The photosensitive material is a negative working material, and it is necessary to expose the material to radiation only in the areas in which an image is desired.

Further, U.S. Pat. No. 4,782,003 (Yoshihara), the disclosure of which is totally incorporated herein by reference, discloses a photosensitive and pressure sensitive recording paper which comprises a support coated with first microcapsules each enclosing contents including a substance which has a hardness changeable corresponding to a quantity of light irradiation thereon and which includes a dye precursor, and with second microcapsules each enclosing a developer which is a thermoplastic substance. Also disclosed is a pressure developing apparatus suitable for pressure developing the photosensitive pressure sensitive recording paper. Upon application of pressure, the microcapsules variously change in hardness in accordance with the varieties of intensity of exposure.

Additionally, U.S. Pat. No. 4,587,194 (Adair et al.), the disclosure of which is totally incorporated herein by reference, discloses an imaging material and process employing photosensitive microcapsules useful in forming two or more image colors by exposure with an intensity of time modulated radiation source such as a laser. The imaging material comprises a support having at least two sets of photosensitive microcapsules on the surface. One set of microcapsules is made up of high speed microcapsules which are more sensitive to a predetermined actinic radiation than a second set of microcapsules made up of lower speed microcapsules. The microcapsules include a photosensitive composition which undergoes a change in viscosity upon exposure to actinic radiation. First and second image forming agents are respectively associated with each set of microcapsules. The imaging material can form images of two or more colors by a process which comprises imagewise exposing the imaging material to actinic radiation at a first exposure amount which is substantially quantitatively different than the second exposure amount, and subjecting the exposed imaging material to a uniform rupturing force such as pressure. U.S. Pat. Nos. 4,399,209 and 4,440,846, the disclosures of which are totally incorporated herein by reference, also disclose imaging sheets containing photosensitive microcapsules wherein images are formed by imagewise exposing the sheets to actinic radiation and subjecting the sheets to a uniform rupturing force.

U.S. Pat. No. 4,508,807 (Adair), the disclosure of which is totally incorporated herein by reference, discloses an imaging material in which images are formed by exposing a sheet having on a surface a layer of microcapsules containing a radiation sensitive internal phase, and rupturing the microcapsules, wherein images in the form of transparent windows are formed in an opaque image-receiving layer containing a light-scattering pigment by rendering the pigment transparent with the internal phase released from the ruptured microcapsules.

U.S. Pat. No. 4,873,219 (Brown et al.), the disclosure of which is totally incorporated herein by reference, discloses an improved self-contained record material having tamper resistance through an indicator quality. The self-contained record material is suitable for forming a visible mark with a focused means of pressure application, such as a stylus, needle, or pen, and which mark can then later be in part fixed by unfocused light. The self-contained record material comprises a substrate on which is coated two sets of microcapsules, only one of which is made photosensitive to change in viscosity upon exposure to actinic radiation, and the first of which are conventional microcapsules. The color formers in each of the sets of microcapsules are selected to express a different observed color. Original markings, for example, can be black (combination of orange and blue color formers). After exposure to actinic radiation desensitizing the blue color former containing capsules, subsequent markings are orange, indicating the aspect of the subsequence in time.

U.S. Pat. No. 4,742,374 (Yamamoto et al), the disclosure of which is totally incorporated herein by reference, discloses a copying apparatus including an image-illuminating device for illuminating a surface of an original having images to be reproduced, so that a light produced by the image-illuminating device is reflected by the image-bearing surface of the original. The reflected light includes rays to which a photosensitive paper is sensitive. Latent images are formed on the photosensitive paper by means of selective exposure of local portions of the photosensitive paper to the rays of the reflected light from the image-bearing surface of the original.

Although known materials and processes are suitable for their intended purposes, a need remains for electrostatic imaging processes with carbonless paper that is suitable for use in printers, copiers, and duplicators. In addition, a need exists for electrostatic imaging processes with carbonless paper that will not contaminate imaging members in printers, copiers, and duplicators. Further, there is a need for electrostatic imaging processes with carbonless paper for which the color former microcapsules will not rupture when passing through pressure nips in various mechanical devices incorporating automated paper handling systems. A need also remains for electrostatic imaging processes with carbonless paper that results in little or no machine contamination when passed through an electrostatic imaging device and that also enables formation of images of acceptable contrast density by application of pressure subsequent to passing through the electrostatic imaging device. Additionally, a need remains for a process of generating images on the sheets of a carbonless paper set wherein the machine is not contaminated and wherein the paper is capable of forming high resolution images by application of pressure subsequent to passing through the device. Further, there is a need for electrostatic imaging processes with carbonless paper that reduces or eliminates unwanted smudging on the paper as a result of pressure exerted on the paper stack in the electrostatic imaging apparatus.

SUMMARY OF THE INVENTION

It is an object of the present invention to provide electrostatic imaging processes with carbonless paper that is suitable for use in printers, copiers, and duplicators.

It is another object of the present invention to provide electrostatic imaging processes with carbonless paper that will not contaminate imaging members in printers, copiers, and duplicators.

It is yet another object of the present invention to provide electrostatic imaging processes with carbonless paper for which the color former microcapsules will not rupture when passing through pressure nips in various mechanical devices incorporating automated paper handling systems.

It is still another object of the present invention to provide electrostatic imaging processes with carbonless paper that results in little or no machine contamination when passed through an electrostatic imaging device and that also enables formation of images of acceptable contrast density by application of pressure subsequent to passing through the electrostatic imaging device.

Another object of the present invention is to provide a process of generating images on the sheets of a carbonless paper set wherein the machine is not contaminated and wherein the paper is capable of forming high resolution images by application of pressure subsequent to passing through the device.

Yet another object of the present invention is to provide electrostatic imaging processes with carbonless paper that reduces or eliminates unwanted smudging on the paper as a result of pressure exerted on the paper stack in an electrostatic imaging apparatus.

These and other objects of the present invention are achieved by providing a process which comprises incorporating into an electrostatic imaging apparatus a recording sheet comprising a support on one surface of which are situated microcapsules which comprise a shell and a core containing a color former and an oil, said microcapsules being strengthened with a polymer capable of degrading upon exposure to actinic radiation; generating an electrostatic latent image on an imaging member in the apparatus; developing the latent image with a developer; transferring the developed image to the recording sheet; and, subsequent to transfer, exposing the recording sheet to actinic radiation at a wavelength at which the polymer will degrade, thereby rendering the microcapsules subject to rupture upon application of pressure. Optionally, recording sheets comprising a support and a color developer can also be incorporated into the imaging apparatus and images can be formed thereon, followed by assembling sets of carbonless paper comprising an imaged color developer sheet and an imaged color former sheet for which the microcapsules have been weakened by subjecting them to radiation. Alternatively, when the recording sheet with the color former microcapsules also contains a color developer on the same surface as the microcapsules, the mating sheets can comprise a support with no color developer coating.

Another specific embodiment of the present invention is directed to a recording sheet comprising a support on one surface of which are situated microcapsules which comprise a core containing a color former and an oil, a first shell, and on the surface of the first shell a second shell comprising a polymer capable of degrading upon exposure to actinic radiation.

Yet another specific embodiment of the present invention is directed to a recording sheet comprising a support on one surface of which are situated microcapsules which comprise a shell and a core containing a color former and an oil, wherein the surface of the recording sheet bearing the microcapsules has an overcoating of a polymer capable of degrading upon exposure to actinic radiation, said polymer being impermeable with respect to the oil prior to degradation and permeable with respect to the oil subsequent to degradation.

DETAILED DESCRIPTION OF THE INVENTION

The carbonless paper sets for the present invention generally comprise at least two support sheets of base paper, each of which contains on one surface either a color former or a color developer. Alternatively, both the color former and the color developer can be contained on the surface of one of the sheets. Optional intermediate sheets contain on one surface a color former and on the other surface a color developer or, alternatively, contain on one surface both a color former and a color developer. The supporting base paper may comprise pulp fibers and blends thereof originating from bleached hardwood and softwood fibers, bleached mechanical pulp fibers, cotton fibers, and synthetic fibers. More specifically, examples of suitable cellulosic pulps include Domtar Seagul W and Q90, a 75/25 percent bleached hardwood and softwood blend of fibers, and 100% bleached groundwood pulp (Acadia Forest Products Ltd.). For those familiar with the art of papermaking, formed sheets derived from cellulosic pulps should be suitably sized so as to minimize penetration of subsequent coating material. Internal and surface sizing treatments include, for example, rosin acid/alum, alkyl ketene dimer, starch, and/or various synthetic polymers.

The color formers generally comprise a binder plus microcapsules containing a color forming material dissolved in a suitable solvent. In general, the color forming material can be either a substantially colorless basic dye precursor, or an organic complexing agent, or a combination of the two. The color forming material may be a colorless basic dye precursor such as, for example, benzoyl leuco methylene blue; diaryl phthalides such as 3,3-bis (4-dimethylaminophenyl)-6-dimethylaminophthalide (Crystal Violet Lactone) and 3,3-bis (4-dimethylaminophenyl) phthalide (Malachit Green Lactone); other phenyl-, indolpyrrol-, and carbazol-substituted phthalides; leucauramines; acyl auramines; unsaturated aryl ketones; basic mono azo dyes; Rhodamine B Lactams; polyaryl carbinols; nitro-, amino-, amindo-, sulfon amido-, aminobenzylidene-, halo-, and anilino-substituted fluorans, such as 3-diethylamino-6-methyl-7-anilinofluoran; spirodipyrans; pyridine and pyrazine compounds; or the like. Examples of colorless basic dye precursors are disclosed in U.S. Pat. Nos. 2,417,897, 3,672,935, 3,681,390, 4,202,820, and 4,675,706, the disclosures of which are totally incorporated herein by reference. The color forming material may also be an organic complexing agent. Examples of organic complexing agents include those listed in U.S. Pat. Nos. 3,481,759, 4,334,015, and 4,372,582, the disclosures of which are totally incorporated herein by reference. Examples of organic complexing agents include dithiooxamide and its derivatives such as N,N'-di-benzyldithiooxamide, N,N'-bis(2-octanlyloxyethyl) dithiooxamide, and di-dodecyl dithiooxamide; aromatic substituted hydrazones such as those disclosed in U.S. Pat. No. 4,334,015 or the like.

Typically the chosen color former material, or combination of color former materials, is dissolved in a suitable organic solvent and encapsulated in a polymeric shell by one of several known encapsulation techniques. Examples of suitable solvents include alkyl biphenyls such as propylbiphenyl and butylbiphenyl; dialkyl phthalates such as diethylphthalate, dibutylphthalate, dioctylphthalate, dinonylphthalate, and ditridecylphthalate; alkylated naphthalenes such as dipropylnaphthalene; C10-C14 alkyl benzenes such as dodecyl benzene; alkyl or aralkyl benzoates such as benzyl benzoate; benzylxylene; benzylbutylphthalate; ethyldiphenylmethane; 2,2,4-trimethyl-1,3-pentanediol diisobutyrate; partially hydrogenated terphenyls; cyclohexane; toluene; 3-heptanone; tributyl phosphate; and mixtures of the above. The solvents for the color former can include any of the above which possess sufficient solubility for the color former. A suitable solvent should be capable of dissolving at least about 1 percent by weight and preferably from about 2 to about 10 percent by weight of the color former. In the case of a basic dye precursor/acidic polymer developer system, or an organic complexing agent/transition metal salt system, the color former solvent preferably is also a cosolvent for the color developer material to promote the color forming reaction. Of course, a suitable solvent must also be a non-solvent for the chosen microcapsule wall material.

Minute droplets of color former solution are produced by emulsifying the solvent oil in an aqueous medium. The color former solution droplets can then be encapsulated in a polymeric shell by any one of a number of known microencapsulation techniques, such as coacervation, complex coacervation, interfacial polymerization, in-situ polymerization, or the like. Methods for encapsulating minute droplets of color former solution in a polymeric shell are described in, for example, U.S. Pat. Nos 2,800,457, 2,800,458, 3,418,250, and 3,516,941, the disclosures of each of which are totally incorporated herein by reference. Capsule wall forming materials include but are not limited to gelatin wall formers such as gum arabic, polyvinyl alcohol, and carboxymethylcellulose; isocyanate wall-formers; urea-formaldehyde and urea-resorcinol-formaldehyde; melamine-formaldehyde; polyurea; polyurethane; polyamide; polyester; and the like. The completed microcapsules are typically from about 1 to about 50 microns and preferably from about 5 to about 10 microns in diameter. The capsule fill of color former in solvent typically comprises from about 50 to about 95 percent of the total capsule weight.

The color former capsules can be reversibly strengthened in several ways. For example, a conventional color former microcapsule can be reinforced by coating the microcapsule with a photodegradable polymer. The top coating of photodegradable polymer can be added in any suitable manner. For example, dry color former capsules can be solvent coated with a photodegradable polymer, followed by redispersion of the coated microcapsules in a liquid such as water for coating onto the paper. Alternatively, the reinforcing shell of photodegradable polymer can be added to the color former microcapsules by dispersing the color former microcapsules in a liquid, such as water, adding a water soluble photodegradable polymer to the dispersion of microcapsules, and causing the polymer to precipitate onto the microcapsules to form a coating, for example by adjusting the pH to cause precipitation of the polymer or by changing the temperature of the dispersion to cause precipitation of the polymer. Another method for applying the photodegradable polymer coating to the microcapsules is to spray coat a solution of the photodegradable polymer onto the microcapsules by any suitable method, such as with a microfluidizer or the like. Yet another method for applying the photodegradable polymer coating to the microcapsules is to spray coat the microcapsules with the monomers that are to be included in the photodegradable polymer and subsequently to polymerize the monomers by any suitable method, such as by irradiation with ultraviolet light or the like. The microcapsules with an outer coating of photodegradable polymer will be strengthened as they pass through an electrostatic imaging device. Subsequently, the paper bearing the microcapsules is exposed to radiation at a wavelength at which the photodegradable polymeric coating will soften, thereby causing chain scission within the photodegradable polymer and changing the relatively tough photodegradable polymer into a relatively soft oligomer so that the pressure sensitivity of the carbonless paper is restored. The outer coating of photodegradable polymer can be of any effective thickness; typically, the outer shell has a thickness of from about 0.01 to about 0.5 microns, and preferably from about 0.05 to about 0.2 microns.

Any suitable photodegradable polymer can be employed for the outer coating. Examples include various copolymers, such as copolymers of monomers such as styrene, N-isopropylacrylamide, acrylates, such as methyl acrylate, ethyl acrylate, or the like, alkylacrylates, such as methyl methacrylate, ethyl methacrylate, methyl ethacrylate, ethyl ethacrylate, butyl methacrylate, or the like, with monomers such as methyl vinyl ketone, methyl isopropenyl ketone, or the like. Monomers such as methyl vinyl ketone and methyl isopropenyl ketone impart photodegradability to the copolymer. Also suitable are copolymers of high pressure polyethyene with carbon monoxide. The monomers can be present in any desired relative amounts. Typically, a photodegradable monomer such as methyl vinyl ketone or methyl isopropenyl ketone will be present in an amount such as from about 0.1 to about 15 percent by weight of the copolymer, with the remaining 85 to 99.9 percent being the other monomer, such as styrene, acrylate, alkylacrylate, or the like, although the monomers can be present in any desired amount. A homopolymer of a photodegradable monomer such as methyl vinyl ketone or methyl isopropenyl ketone can also be employed, particularly in embodiments of the present invention wherein conventional carbonless paper microcapsules are reinforced with the photodegradable polymer. These polymers typically have softening points of from about 60° to about 80° C. Homopolymers or copolymers suitable for the present invention can be prepared by any suitable method. For example, the monomers can be polymerized by bulk phase free radical polymerization, wherein the monomers are mixed together with a free radical initiator, such as azobisisobutyronitrile or the like, followed by heating the mixture to the activation temperature of the free radical initiator until the polymerization is complete. This polymerization process is similar to that employed to polymerize the core monomers in encapsulated toners useful as electrostatic developers, such as those disclosed in U.S. Pat. No. 4,937,167, the disclosure of which is totally incorporated herein by reference. Other suitable photodegradable polymers are those that are cross-linked and become decrosslinked upon exposure to actinic radiation, such as those materials disclosed in "Imaging by Photodecoupling of Crosslinks in Polymer Gels," M-Y Li et al., *Journal of Imaging Science*, Vol. 34, No. 6, page 259 (1990), the disclosure of which is totally incorporated herein by reference. Examples of preferred materials include homopolymers and copolymers of butylmethacrylate using o-acyloxime as a crosslinker. Also suitable as photodegradable polymers for the present invention are polymeric materials such as positive photoresists used in photodegradable printing plates.

In addition to adding a reinforcing coating to a conventional color former microcapsule, the color former microcapsule can be prepared with a photodegradable shell by conventional techniques such as coacervation, complex coacervation, interfacial polymerization, in-situ polymerization, or the like. The photodegradable polymers and processes for preparing them employed for this embodiment can be the same as those described herein with respect to the embodiment wherein conventional microcapsules are coated with a photodegradable polymer. Subsequent to passing through the imaging apparatus, the paper bearing the microcapsules is exposed to radiation at a wavelength at which the photodegradable polymeric shell will soften. In the instance wherein the entire microcapsule sheel is of a photodegradable polymer, the paper is exposed to radiation only for sufficient time and at sufficient intensity to cause partial degradation of the capsule shells, so that the shells remain intact but are weakened sufficiently to allow formation of images of acceptable image contrast upon imagewise application of pressure to the top sheet in the carbonless paper set. It may not be desirable to employ homopolymers of photodegradable monomers for the shells in this embodiment to avoid complete degradation of the shell upon exposure to radiation, unless the shell is of sufficient thickness that complete degradation does not occur.

Another method of reversibly strengthening the color former microcapsules is to include a photodegradable polymer in the core portion of the microcapsules. A color former capsule originally containing a solid core containing a photodegradable material that is resistant to rupture under pressure can be exposed to radiation to cause the photodegradable core material to soften, which then renders the capsule capable of being ruptured under pressure. The capsules can be prepared by any suitable process. For example, the monomers that will make up the photodegradable polymer can be mixed with the oil soluble color former solution along with an initiator and, if desired, a crosslinker, followed by heating to form capsules internally reinforced with a photodegradable polymer gel which can be softened upon photodegradation by, for example, exposure to ultraviolet radiation. Typically, the amount of photodegradable polymer present is from about 1 to about 20 percent by weight of the core material, although the amount can be outside this range. Examples of suitable photodegradable core polymers include 3-oximino-2-butanone methacrylate and its copolymers in which the concentration of 3-oximino-2-butanone methacrylate is at least 10 mole percent, poly 4'-alkyl acylophenones wherein the alkyl portion has from 1 to about 6 carbon atoms, resins having a quinone diazide residue and exhibiting solutility in the core oil, and the like. The photodegradable polymer is present in the core in any effective amount. Typically, the core comprises from about 1 to about 30 percent by weight of the polymer, and preferably from about 2 to about 10 percent by weight. If desired, the core can also contain a sensitizer, typically in concentrations of from about 1 to about 15 percent by weight of the photodegradable polymer, such as benzophenone, benzophenone derivatives, N-acetylcarbazole, p-t-butylbenzoic acid, naphthalene-2-acetic acid, and the like, as well as mixtures thereof.

Further details regarding incorporation of photosoftenable polymers in capsule cores and suitable materials is disclosed in U.S. Pat. Nos. 4,587,194, 4,873,219, and 4,508,807, the disclosures of each of which are totally incorporated herein by reference. The photodegradable polymer in the color former core internally reinforces the microcapsule, thus strengthening the microcapsules as they pass through an electrostatic imaging device and preventing machine contamination. Subsequent to passing through the imaging apparatus, the paper bearing the microcapsules is exposed to radiation at a wavelength at which the photodegradable polymeric material in the core will soften so that the microcapsules are weakened sufficiently to allow formation of images of acceptable image contrast upon imagewise application of pressure to the top sheet in the carbonless paper set.

Yet another method of reversibly strengthening the color former microcapsules is to apply a thin overcoat of a transparent photodegradable polymer to the color former coating of a carbonless paper sheet. The photodegradable coating can prevent rupture of the individual microcapsules. In addition or alternatively, the photodegradable coating can be selected so that it is impermeable to the solvent oil in which the color former is dispersed, so that any oil from broken capsules cannot escape from the sheet and contaminate the imaging apparatus. Subsequent to passing through the imaging apparatus, the paper bearing the microcapsules and the photodegradable coating is exposed to radiation at a wavelength at which the photodegradable polymeric coating is degraded sufficiently to allow formation of images of acceptable image contrast upon imagewise application of pressure to the top sheet in the carbonless paper set. Sensitization by exposure to radiation results in the overcoat photodegrading and becoming sufficiently weak to allow the solvent oil and color former in the color former capsules to transfer to the carbonless paper sheet in contact with the color former sheet and cause color development. The overcoat generally has a thickness of from about 0.01 to about 0.5 microns, and preferably from about 0.05 to 0.2 microns. Any suitable photodegradable polymer can be used. Preferably, the photodegradable polymer is soluble in solvents such as alcohols or water for health, safety, and environmental reasons. Examples of photodegradable polymers and processes for preparing them suitable for this embodiment of the present invention include those described herein with respect to the embodiment wherein conventional microcapsules are coated with a photodegradable polymer.

A coating formulation is prepared by mixing an aqueous dispersion of microcapsules containing color former solution with an aqueous dispersion of a suitable binder, such as starch, polyvinyl alcohol, latex, or the like with a capsule:binder ratio typically being from about 9:1 to about 7:3. The capsule plus binder dispersion is then coated onto a paper support using any one of a number of known paper coating techniques, such as roll, gravure, air-knife, blade, rod, or slot die coating, although methods that minimize capsule breakage, such as roll and air-knife, are preferred.

Optionally, the color former coating can also include from about 5 to about 10 percent by weight of particles of somewhat larger size than the microcapsules. For example, as disclosed in U.S. Pat. No. 4,630,079, the disclosure of which is totally incorporated herein by reference, the color former coating contains particles of somewhat larger size than the microcapsules to prevent or reduce accidental or premature breakage of the microcapsules. Such particles typically comprise fine powders of cellulose, starch granules, or various types of plastic beads. Dry coat weights for the color former coating typically range from about 2 to about 10 grams per square meter, which typically includes from about 1 to about 5 grams per meter of solvent and from about 0.01 to about 0.1 grams per square meter of color former, with the balance comprising binder, capsule material, and any other ingredients in the coating.

For a basic dye precursor color former, the corresponding color developer generally comprises an acidic developer material. Acidic color developers may be inorganic pigments such as acidic clay, active clay, attapulgite, zeolite, bentonite, kaolin, silicic acid, synthetic silicic acid, aluminum silicate, zinc silicate, and the like; organic acids such as tannic acid, gallic acid, benzoic acid, propyl gallate, and bisphenol-A; acidic polymers such as phenolic resins, including phenol-aldehyde polymers, phenol-acetylene polymers, and rosin maleate resin; aromatic carboxylic acids such as salicylic acid and its derivatives; metal salts of aromatic carboxylic acids such as zinc salicylate; zinc-chelated phenolic resins; oil soluble metal salts of phenol-formaldehyde resins; and combinations of the above. To produce the bottom sheet of a carbonless paper set, solid particles of the color developer material are mixed with a suitable binder such as latex, polyvinyl alcohol, starch, gum arabic, or other film-forming material, and coated on the top of a paper support. The acidic color developer material may also be mixed with neutral inorganic pigments such as various clays or calcium carbonate, along with a suitable binder to form the color developer coating. In the case of an inorganic acidic developer material, a coating formulation is prepared by mixing an aqueous dispersion of the acid clay with a suitable binder such as starch, polyvinyl alcohol, or latex, with a clay:binder ratio typically between about 9:1 and about 6:4. This mixture can be coated onto a paper support by any of a number of known techniques, including roll, gravure, air-knife, blade, slot die, or the like. In the case of an organic acidic color developer material, it may be dissolved or dispersed in a suitable organic solvent vehicle to form a printing ink that can be coated on a paper support by any of a number of known techniques. Alternately, the organic acidic developer material may be ground into fine particle form, to furnish a large reactant surface per unit area for the color former, and mixed in an aqueous dispersion with a suitable binder, with particle:binder ratios typically between about 9:1 and about 6:4, and coated on a paper support by any of a number of known techniques. Additionally, fine particles of organic acidic color developer may be mixed with a neutral inorganic pigment such as various clays or calcium carbonate to promote absorption of the color former solution, and dispersed in an aqueous medium with suitable binders, with typical acid resin:pigment:binder ratios of 15:75:10, and coated on a paper support by any of a number of known techniques. Acidic color developers are disclosed in, for example, U.S. Pat. Nos. 3,244,550, 3,672,935, 3,732,120, 3,843,383, and 3,934,070, the disclosures of each of which are totally incorporated herein by reference.

For an organic complexing agent color former, the corresponding color developer generally comprises a salt of a transition metal such as Ni, Cu, Co, or Zn. Examples of transition metal salts for color developers include nickel 2-ethylhexoate and nickel rosinate. A color developer sheet may be produced by adding to the initial paper pulp slurry a water soluble rosin salt such as sodium rosinate, along with a water soluble metal salt such as nickel sulphate, which causes an insoluble metal rosinate, i.e. nickel rosinate, to be precipitated as a sizing on the paper fibers. The treated fibers are then formed into a paper sheet by conventional papermaking techniques. Alternately, an aqueous dispersion of nickel rosinate may be coated on the surface of a paper support by any of a number of known techniques. Additionally, a transition metal salt such as nickel 2-ethylhexoate may be combined in an aqueous dispersion with an inorganic pigment such as various clays or aluminum oxide, along with suitable binders, and coated on a paper support by any of a number of known techniques. To produce the bottom sheet of a carbonless paper set, the transition metal salt is mixed with an inorganic pigment such as various clays, along with a suitable binder, and coated on the top of a paper support. Transition metal color developers are disclosed in U.S. Pat. Nos. 3,481,759, 3,809,668, and 4,334,015, the disclosures of which are totally incorporated herein by reference. As disclosed in U.S. Pat. No. 4,372,582, the disclosure of which is totally incorporated herein by reference, if the microencapsulated color former is a combination of a basic dye precursor and an organic complexing agent, the appropriate color developer coating contains both an acidic developer material and a transition metal salt.

In all cases, the dry coat weight of the color developer coating typically ranges from about 1 to about 10 grams per square meter, which generally includes from about 0.5 to about 5 grams per square meter of color developer material. In general, there is typically an excess of color developer available to the color former material, or at least 5 to 10 grams of color developer per gram of color former.

The present invention is directed to a process for generating images on the sheets of a carbonless paper set of the present invention. This process comprises generating an electrostatic latent image of one polarity on an imaging member in an imaging apparatus, followed by developing the latent image with toner particles charged to a polarity opposite to that of the latent image. The imaging apparatus may be any conventional imaging apparatus wherein an electrostatic latent image is formed and developed by a developer, including electrophotographic copiers, printers, and duplicators and ionographic apparatus as illustrated in, for example, U.S. Pat. Nos. 4,524,371 and 4,463,363, the disclosures of which are totally incorporated herein by reference. The imaging member may be charged either positively or negatively, and may be any imaging member suitable for electrophotographic or ionographic processes. Generally, the latent image may be developed with any single component or two component developer wherein the toner is charged to a polarity opposite to the polarity of the latent image; thus, negatively charged toners are generally employed with positively charging imaging members and positively charged toners are generally employed with negatively charging imaging members. Development may be by any suitable process, such as magnetic brush development, powder cloud development, cascade development, or the like.

Subsequent to development, the developed image is brought into contact with the surface of the recording sheet. Generally, the developed image is contacted to the surface opposite to that bearing the color former microcapsules, although developed images can also be transferred to the microcapsule-coated surface of the carbonless paper. An electric charge is applied to the side of the sheet opposite the side in contact with the imaging member by means of an ion deposition device such as a corotron, or by contacting the back side of the sheet with a bias transfer roll that is maintained at a voltage larger in magnitude and of the same polarity as the voltage of the latent image. When a positively charging imaging member and a negatively charged toner are employed, a positive charge is applied to the back side of the sheet; when a negatively charging imaging member and a positively charged toner are employed, a negative charge is applied. The charge applied to the back side of the recording sheet by the corotron or bias transfer roll attracts the toner particles to the paper, thereby effecting transfer of the developed image from the imaging member to the sheet. The transferred image can optionally be permanently affixed to the paper by conventional methods, such as radiant fusing, cold pressure fusing, heat fusing, application of a combination of heat and pressure, solvent fusing, and the like. Subsequent to transfer and fusing, the color former microcapsules are rendered susceptible to rupture by pressure by exposing the color former microcapsules to actinic radiation at a wavelength and intensity at which the photodegradable polymer will degrade.

Additional latent images can be generated and developed, with each being successively transferred to the remaining sheets of paper in the carbonless paper set, followed by assembly of the sets with printed images. Application of pressure in imagewise fashion to the top sheet in the set by, for example, a pen or pencil or typewriter results in formation of corresponding images on the lower sheets as a result of the rupture of the color former microcapsules and the interaction between color former and color developer.

The color former microcapsules can be exposed to radiation after they exit the imaging apparatus. Optionally, the imaging apparatus can be equipped with a radiation source so that the color former microcapsules can be exposed to radiation subsequent to transfer and fusing and prior to the paper exiting the machine. For example, a lamp with a power P and a width W, installed in a xerographic duplicator with a paper speed v, supplies an energy density $\epsilon = P \div (vW)$. Thus, in a high speed machine that generates about 60 to 120 copies per minute and has a paper speed of about 25 to 50 centimeters per second, the machine equipped with a lamp with a width of 11 inches (28 centimeters) and a power of 100 watts will produce an exposure energy density of 70 to 140 milliJoules per square centimeter. An energy of about 100 milliJoules per square centimeter is sufficient to photodegrade most photodegradable polymers in a layer thickness of about 2.5 microns. Thus, an imaging apparatus can be equipped with an exposure lamp with minimal extra power requirements.

Any type of actinic radiation can be employed to soften the color former microcapsules, depending on the polymer selected to strengthen them prior to imaging. The terms "actinic radiation" and "radiation" as used herein include the entire electromagnetic spectrum as well as particle radiation such as electron beam or ion beam exposure. A photodegradable polymer sensitive to visible light can be employed, but in this instance the carbonless paper must be maintained in the dark prior to and while passing through the electrostatic imaging apparatus. Preferably, the photodegradable polymer selected is sensitive to a specific wavelength of radiation and does not require specific handling procedures to shield the paper from radiation prior to imaging. Examples of wavelengths include ultraviolet, visible, infrared, X-ray, electron beam, microwave, or the like. One wavelength preferred, particularly when the photodegradable polymer is a crosslinked polymer that decrosslinks upon exposure to radiation, is in the ultraviolet wavelength range, at around 250 to 350 nanometers. Radiation at this wavelength is available from various sources, such as low and medium pressure mercury lamps.

Exposure to radiation is for a time and at an intensity sufficient to result in softening of the microcapsules to an extent that they are subject to rupture by application of pressure. The specific time and intensity for exposure will depend on factors such as the specific photodegradable polymer selected, the thickness or amount of photodegradable polymer present, and the like. The microcapsules are exposed to radiation for a period of from about 1 second to about 5 minutes, and probaby from about 1 second to about 1 minute although greater or lesser exposure times can be used, and at intensities of from about 1 to about 500 milliJoules per square centimeter, preferably from about 5 to about 200 milliJoules per square centimeter, although other intensities can be employed. In the instance wherein the microcapsules have a shell consisting only of a photodegradable polymer, the radiation exposure is ceased prior to complete degradation, so that the microcapsule shells are made thinner but the shells remain intact. Further information regarding the irradiation process is disclosed in, for example, "Gray-Scale Characteristics of the Microencapsulated Acrylate Process of Imaging," J. S. Arney et al., *Journal of Imaging Science*, Vol. 34, No. 6, page 265 (1990), the disclosure of which is totally incorporated herein by reference.

Any suitable developing processes and materials can be employed with the present invention. For example, dry development processes can be employed, either single component development processes in which the developer material consists essentially of toner particles, or two component development processes, wherein the developer material comprises toner particles and carrier particles. Typical toner particles can be of any composition suitable for development of electrostatic latent images, such as those comprising a resin and a colorant. Typical toner resins include polyesters, polyamides, epoxies, polyurethanes, diolefins, vinyl resins and polymeric esterification products of a dicarboxylic acid and a diol comprising a diphenol. Examples of vinyl monomers include styrene, p-chlorostyrene, vinyl naphthalene, unsaturated mono-olefins such as ethylene, propylene, butylene, isobutylene and the like; vinyl halides such as vinyl chloride, vinyl bromide, vinyl fluoride, vinyl acetate, vinyl propionate, vinyl benzoate, and vinyl butyrate; vinyl esters such as esters of monocarboxylic acids, including methyl acrylate, ethyl acrylate, n-butyl acrylate, isobutyl acrylate, dodecyl acrylate, n-octyl acrylate, 2-chloroethyl acrylate, phenyl acrylate, methylalpha-chloroacrylate, methyl methacrylate, ethyl methacrylate, butyl methacrylate, and the like; acrylonitrile, methacrylonitrile, acrylamide, vinyl ethers, including vinyl methyl ether, vinyl isobutyl ether, and vinyl ethyl ether; vinyl ketones such as vinyl methyl ketone, vinyl hexyl ketone, and methyl isopropenyl ketone; N-vinyl indole and N-vinyl pyrrolidene; styrene butadienes; mixtures of these monomers; and the like. The resins are generally present in an amount of from about 30 to about 99 percent by weight of the toner composition, although they can be present in greater or lesser amounts, provided that the objectives of the invention are achieved.

Any suitable pigments or dyes or mixture thereof can be employed in the toner particles. Typical pigments or dyes include carbon black, nigrosine dye, aniline blue, magnetites, and mixtures thereof, with carbon black being a preferred colorant. The pigment is preferably present in an amount sufficient to render the toner composition highly colored to permit the formation of a clearly visible image on a recording member. Generally, the pigment particles are present in amounts of from about 1 percent by weight to about 20 percent by weight based on the total weight of the toner composition; however, lesser or greater amounts of pigment particles can be present provided that the objectives of the present invention are achieved.

Other colored toner pigments include red, green, blue, brown, magenta, cyan, and yellow particles, as well as mixtures thereof. Illustrative examples of suitable magenta pigments include 2,9-dimethyl-substituted quinacridone and anthraquinone dye, identified in the Color Index as CI 60710, CI Dispersed Red 15, a diazo dye identified in the Color Index as CI 26050, CI Solvent Red 19, and the like. Illustrative examples of suitable cyan pigments include copper tetra-4-(octadecyl sulfonamido) phthalocyanine, X-copper phthalocyanine pigment, listed in the color index as CI 74160, CI Pigment Blue, and Anthradanthrene Blue, identified in the Color Index as CI 69810, Special Blue X-2137, and the like. Illustrative examples of yellow pigments that can be selected include diarylide yellow 3,3-dichlorobenzidene acetoacetanilides, a monoazo pigment identified in the Color Index as CI 12700, CI Solvent Yellow 16, a nitrophenyl amine sulfonamide identified in the Color Index as Foron Yellow SE/GLN, CI Dispersed Yellow 33, 2,5-dimethoxy-4-sulfonanilide phenylazo-4'-chloro-2,5-dimethoxy aceto-acetanilide, Permanent Yellow FGL, and the like. These color pigments are generally present in an amount of from about 5 weight percent to about 20.5 weight percent based on the weight of the toner resin particles, although lesser or greater amounts can be present provided that the objectives of the present invention are met.

When the pigment particles are magnetites, which comprise a mixture of iron oxides ($Fe_3O_4$) such as those commercially available as Mapico Black, these pigments are present in the toner composition in an amount of from about 10 percent by weight to about 70 percent by weight, and preferably in an amount of from about 20 percent by weight to about 50 percent by weight, although they can be present in greater or lesser amounts, provided that the objectives of the invention are achieved.

The toner compositions can be prepared by any suitable method. For example, a method known as spray drying entails dissolving the appropriate polymer or resin in an organic solvent such as toluene or chloroform, or a suitable solvent mixture. The toner colorant is also added to the solvent. Vigorous agitation, such as that obtained by ball milling processes, assists in assuring good dispersion of the colorant. The solution is then pumped through an atomizing nozzle while using an inert gas, such as nitrogen, as the atomizing agent. The solvent evaporates during atomization, resulting in toner particles of a pigmented resin, which are then attrited and classified by particle size. Particle diameter of the resulting toner varies, depending on the size of the nozzle, and generally varies between about 0.1 and about 100 microns.

Another suitable process is known as the Banbury method, a batch process wherein the dry toner ingredients are pre-blended and added to a Banbury mixer and mixed, at which point melting of the materials occurs from the heat energy generated by the mixing process. The mixture is then dropped into heated rollers and forced through a nip, which results in further shear mixing to form a large thin sheet of the toner material. This material is then reduced to pellet form and further reduced in size by grinding or jetting, after which the particles are classified by size. A third suitable toner preparation process, extrusion, is a continuous process that entails dry blending the toner ingredients, placing them into an extruder, melting and mixing the mixture, extruding the material, and reducing the extruded material to pellet form. The pellets are further reduced in size by grinding or jetting, and are then classified by particle size. Dry toner particles for two-component developers generally have an average particle size between about 6 micrometers and about 20 micrometers. Other similar blending methods may also be used. Subsequent to size classification of the toner particles, any external additives are blended with the toner particles. The resulting toner composition is then mixed with carrier particles such that the toner is present in an amount of about 1 to about 5 percent by weight of the carrier, and preferably about 3 percent by weight of the carrier, although different toner to carrier ratios are acceptable, provided that the objectives of the present invention are achieved.

Any suitable external additives can also be utilized with the dry toner particles. The amounts of external additives are measured in terms of percentage by weight of the toner composition, but are not themselves included when calculating the percentage composition of the toner. For example, a toner composition containing a resin, a pigment, and an external additive can comprise 80 percent by weight resin and 20 percent by weight pigment; the amount of external additive present is reported in terms of its percent by weight of the combined resin and pigment. External additives can include any additives suitable for use in electrostatographic toners, including straight silica, colloidal silica (e.g. Aerosil R972 ®, available from Degussa, Inc.), ferric oxide, Unilin ®, (a linear polymeric alcohol with from about 30 to about 300 carbon atoms, available from Petrolite Chemical Co.) polypropylene waxes, polymethylmethacrylate, zinc stearate, chromium oxide, aluminum oxide, stearic acid, polyvinylidene fluoride (e.g. Kynar ®, available from Pennwalt Chemicals Corporation), and the like. External additives can be present in any suitable amount, provided that the objectives of the present invention are achieved.

Any suitable carrier particles can be employed with the toner particles. Typical carrier particles include granular zircon, steel, nickel, iron ferrites, and the like. Other typical carrier particles include nickel berry carriers as disclosed in U.S. Pat. No. 3,847,604, the entire disclosure of which is incorporated herein by reference. These carriers comprise nodular carrier beads of nickel characterized by surfaces of reoccurring recesses and protrusions that provide the particles with a relatively large external area. The diameters of the carrier particles can vary, but are generally from about 50 microns to about 1,000 microns, thus allowing the particles to possess sufficient density and inertia to avoid adherence to the electrostatic images during the development process. Carrier particles can possess coated surfaces. Typical coating materials include polymers and terpolymers, including, for example, fluoropolymers such as polyvinylidene fluorides as disclosed in U.S. Pat. Nos. 3,526,533, 3,849,186, and 3,942,979, the disclosures of each of which are totally incorporated herein by reference. The toner may be present, for example, in the two-component developer in an amount equal to about 1 to about 5 percent by weight of the carrier, and preferably is equal to about 3 percent by weight of the carrier.

Typical dry toners are disclosed in, for example, U.S. Pat. Nos. 2,788,288, 3,079,342, and U.S. Pat. No. Re. 25,136, the disclosures of each of which are totally incorporated herein by reference.

In addition, if desired, development can be effected with liquid developers. Liquid developers are disclosed, for example, in U.S. Pat. Nos. 2,890,174 and 2,899,335, the disclosures of each of which are totally incorporated herein by reference.

Any suitable conventional electrophotographic development technique can be utilized to deposit toner particles on the electrostatic latent image on the imaging member. Well known electrophotographic development techniques include magnetic brush development, cascade development, powder cloud development, electrophoretic development, and the like. Magnetic brush development is more fully described in, for example, U.S. Pat. No. 2,791,949, the disclosure of which is totally incorporated herein by reference; cascade development is more fully described in, for example, U.S. Pat. Nos. 2,618,551 and 2,618,552, the disclosures of each of which are totally incorporated herein by reference; powder cloud development is more fully described in, for example, U.S. Pat. Nos. 2,725,305, 2,918,910, and 3,015,305, the disclosures of each of which are totally incorporated herein by reference; and liquid development is more fully described in, for example, U.S. Pat. No. 3,084,043, the disclosure of which is totally incorporated herein by reference.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

A xerographic carbonless paper with reversibly strengthened microcapsules is prepared by coating NCR Rally Grade carbonless paper (available from Appleton Papers, Appleton, Wis.) on the surface bearing the rupturable color former microcapsules with a solution comprising about 80 percent by weight methoxy ethyl acetate and about 20 percent by weight poly(methyl methacrylate-co-3-oximino-2-butanone-methacrylate). The poly(methyl methacrylate-co-3-oximino-2-butanone-methacrylate) is prepared in ethyl acetate solution at reflux temperature using benzoyl peroxide as initiator and is isolated by precipitation from methanol by the procedure disclosed by E. Reichmanis and C. W. Wilkins, Jr., ACS (Div. Org.) Coat. Plat. Chem. Preprints, Vol. 43, 1980, the disclosure of which is totally incorporated herein by reference. The solution is coated onto the paper with an air knife and the coating is allowed to dry, resulting in a dry coating of about 0.05 microns in thickness.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 230 to about 260 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE II

A xerographic carbonless paper with reversibly strengthened microcapsules is prepared by coating 3M Tartan carbonless paper (available from Minnesota Mining and Manufacturing Co., St. Paul, Minn.) on the surface bearing the rupturable microcapsules with a solution comprising about 70 percent by weight methoxy ethyl acetate and about 30 percent by weight poly(methyl methacrylate-co-3-oximino-2-butanone-methacrylate-co-methacrylonitrile). The poly(methyl methacrylate-co-3-oximino-2-butanone-methacrylate) is prepared in ethyl acetate solution at reflux temperature using benzoyl peroxide as initiator and is isolated by precipitation from methanol by the procedure disclosed by E. Reichmanis and C. W. Wilkins, Jr., ACS (Div. Org.) Coat. Plat. Chem. Preprints, Vol. 43, 1980. The solution is coated onto the paper with an air knife and the coating is allowed to dry, resulting in a dry coating of about 0.05 microns in thickness.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 230 to about 260 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE III

A xerographic carbonless paper with reversibly strengthened microcapsules is prepared by coating 3M Tartan carbonless paper (available from Minnesota Mining and Manufacturing Co., St. Paul, Minn.) on the surface bearing the rupturable microcapsules with a solution comprising about 75 percent by weight water and about 25 percent by weight of a copolymer of N-isopropylacrylamide (90 mole percent) and methyl vinyl ketone (10 mole percent). The copolymer of N-isopropylacrylamide and methyl vinyl ketone is prepared by a method as disclosed by W. C. Wooten, R. B. Blanton and H. W. Coover Jr., *J. Polymer. Sci.*, Vol. 25, 403 (1957), the disclosure of which is totally incorporated herein by reference, wherein the free radical initiator system is the redox catalyst ammonium persulfate-sodium bisulfite in water at room temperature. The solution is coated onto the paper with a flexible inverted blade knife coating system and the coating is allowed to dry, resulting in a dry coating of about 0.05 microns in thickness.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE IV

A xerographic carbonless paper with reversibly strengthened microcapsules is prepared by preparing a coating solution wherein the solids content comprises about 100 parts by weight of color former microcapsules (typically about 3 to about 10 microns in average particle diameter, Baymicron VPFE 2117 (Black), available from Bayer USA, Pittsburgh, Pa., about 20 parts by weight spacer particles (typically about 15 to about 20 microns in average particle diameter, consisting of thermo-resistant calibrated wheat starch, available from Amylum, N.V., Aalst, Belgium), and about 30 parts by weight of a binder material (about 30 percent by weight polyvinyl alcohol, available from Air Products and Chemicals Inc., Allentown, Pa., and about 70 percent by weight poly(acrylic acid, Na salt-co-methyl vinyl ketone), prepared by a free radical polymerization process). The solid components of the coating material are mixed together in water so that the resulting solution contains about 30 percent by weight solids.

The solution thus formed is then coated onto Xerox ® 4024 paper with an air knife, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheetcoated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE V

A xerographic carbonless paper with reversibly strengthened microcapsules is prepared by preparing a coating solution wherein the solids content comprises about 100 parts by weight of color former microcapsules (typically about 3 to about 10 microns in average particle diameter, Baymicron VPFE 2114 (Contrast Blue), available from Bayer USA, Pittsburgh, Pa.), and about 20 parts by weight of a binder material (about 30 percent by weight potato starch, available from Nalco Chemical Co. Naperville, Ill., and about 70 percent by weight poly(acrylic acid, Na salt-co-methyl vinyl ketone), prepared by a free radical process). The solid components of the coating material are mixed together in water so that the resulting solution contains about 40 percent by weight solids.

The solution thus formed is then coated onto Xerox ® 4024 paper by a roll coating technique, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE VI

A xerographic carbonless paper with reversibly strengthened microcapsules is prepared by mixing together about 100 parts by weight of a Solvent Oil with dissolved Color Former, consisting of an alkyl biphenyl solvent oil (Sure Sol-290, available from Koch Chemical Co., Corpus Christi, Tex.), containing 3% by weight of dissolved color former (Crystal Violet Lactone, available from Nachem Inc., Braintree, Mass.), about 3 parts by weight of n-butyl methacrylate, available from Polysciences, Warrington, PA, about 2 parts by weight of 2,2'-azobisisobutyronitrile (polymerization initiator, available from Polysciences, Inc., Warrington, PA), an O-acyloxime crosslinking moiety incorporated into a bisacrylate monomer as shown by M. Y. Li et al. in *J. Imaging Science*, Vol. 34, No. 6, 259–264 (1990) and Delzenne et al., *Europ. Polym. J.*, Vol. 6, 933 (1970), the disclosures of each of which are totally incorporated herein by reference) in an amount of about 1 percent by weight of the n-butylmethacrylate, and n-dodecyl mercaptan (chain transfer agent, available from Aldrich, Milwaukee, Wis.) in an amount of about 3 percent by weight of the butylmethacrylate. Microcapsules are prepared as described in U.S. Pat. No. 4,663,266, the disclosure of which is totally incorporated herein by reference, wherein the microcapsule walls are urea-resorcinolformaldehyde. Upon formation of the capsule shells, the capsules are heated to a temperature of from about 65° to about 80° C. for a period of about 4 hours to complete formation of a methacrylate gel within the capsule cores, resulting in microcapsules internally reinforced with a butyl methacrylate polymer gel.

A coating solution is then prepared wherein the solids content comprises about 100 parts by weight of the internally reinforced color former microcapsules thus prepared, about 30 parts by weight spacer particles (typically about 15 to about 20 microns in average particle diameter, consisting of thermo-resistant calibrated wheat starch, available from Amylum, N.V., Aalst, Belgium) and about 20 parts by weight of a binder material (polyvinyl alcohol, obtained from Air Products and Chemicals Inc., Allentown, Pa.). The solid components of the coating material are mixed together in water so that the resulting solution contains about 40 percent by weight solids.

The solution thus formed is then coated onto Xerox ® 4024 paper by a reverse gravure coating technique, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 millijoules per square centimeter. After exposure to radiation, it is believed that images can be formed on the papers in the stack by any imaging method entailing the use of pressure, such as a typewriter or a writing pen.

EXAMPLE VII

A xerographic carbonless paper with reversibly strengthened microcapsules is prepared by mixing together about 100 parts by weight of a Solvent Oil with dissolved Color Former, consisting of an alkyl biphenyl solvent oil (Sure Sol-290, available from Koch Chemical Co., Corpus Christi, Tex.), containing 3% by weight of dissolved color former (Crystal Violet Lactone, available from Nachem Inc., Braintree, Mass.), about 10 parts by weight of n-butyl methacrylate, about 2 parts by weight of 2,2'-azobisisobutyronitrile (polymerization initiator, available from Polysciences, Inc., Warrington, Pa.), an O-acyloxime crosslinking moiety incorporated into a bisacrylate monomer as disclosed in *J. Imaging Science*, Vol. 34, No. 6, 259–264 (1990) and *Europ. Polym. J.* Vol. 6, 933 (1970) in an amount of about 5 percent by weight of the butylmethacrylate, and n-dodecyl mercaptan (chain transfer agent, available from Aldrich, Milwaukee, Wis.) in an amount of about 0.1 percent by weight of the butylmethacrylate. Microcapsules are prepared as described in U.S. Pat. No. 4,663,266, wherein the microcapsule walls are gelatin. Upon formation of the capsule shells, the capsules are heated to a temperature of from about 65° to about 80° C. for a period of about 4 hours to complete formation of a methacrylate gel within the capsule cores, resulting in microcapsules internally reinforced with a butyl methacrylate polymer gel.

A coating solution is then prepared wherein the solids content comprises about 100 parts by weight of the internally reinforced color former microcapsules thus prepared, and about 20 parts by weight of a binder material (polyvinyl alcohol, obtained from Air Products and Chemicals Inc., Allentown, Pa.). The solid components of the coating material are mixed together in water so that the resulting solution contains about 40 percent by weight solids.

The solution thus formed is then coated onto Xerox ® 4024 paper by a reverse gravure roll coating technique, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE VIII

A xerographic carbonless paper with reversibly strengthened microcapsules is prepared by mixing together about 80 parts by weight of an aqueous slurry of carbonless microcapsules (containing 20 to 30 percent by weight microcapsules in water, available as Baymicron VPFE 2117 (Black) from Bayer USA, Pittsburgh, Pa.,) and about 20 parts by weight of a solution containing 98 percent by water and 2 percent by weight of a copolymer of N-isopropylacrylamide (90 mole percent) and methyl vinyl ketone (10 mole percent). The copolymer of N-isopropylacrylamide and methyl vinyl ketone is prepared by a method as disclosed by W. C. Wooten, R. B. Blanton and H. W. Coover, Jr., *J. Polymer. Sci.*, Vol. 25, 403 (1957), the disclosure of which is totally incorporated herein by reference, wherein the free radical initiator system is the redox catalyst ammonium persulfate-sodium bisulfite in water at room temperature. The temperature of the slurry is then increased slowly to over 30° C., which is the precipitation temperature of the copolymer, and less than about 40° C., thus resulting in the microcapsules becoming coated with the copolymer. The slurry is then maintained at a temperature of over 30° C., and to 100 parts by weight of the slurry is added about 20 parts by weight of corn starch, available from Cargill Inc., Cedar Rapids, Iowa, and about 30 parts by weight of spacer particles (typically about 15 to about 20 microns in average particle diameter, consisting of thermo-resistant calibrated wheat starch, available from Amylum, N.V., Aalst, Belgium). The solution thus formed is then coated onto onto Xerox ® 4024 paper by a roll coating technique, . resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE IX

A xerographic carbonless paper with reversibly strengthened microcapsules is prepared by mixing together 80 parts by weight of an aqueous slurry of carbonless microcapsules (containing 20 to 30 percent by weight microcapsules in water, available as Baymicron VPFE 2117 (Black) from Bayer USA, Pittsburgh, Pa.) and 20 parts by weight of a solution containing about 99.9 percent by weight water and about 0.1 parts by weight of a copolymer of N-isopropylacrylamide (90 mole percent) and methyl vinyl ketone (10 mole percent). The copolymer of N-isopropylacrylamide and methyl vinyl ketone is prepared by a method as disclosed by W. C. Wooten, R. B. Blanton and H. W. Coover Jr., *J. Polymer. Sci.*, Vol. 25, 403 (1957), wherein the free radical initiator system is the redox catalyst ammonium persulfate-sodium bisulfite in water at room temperature. The temperature of the slurry is then increased slowly to over 30° C., which is the precipitation temperature of the copolymer, and less than 40° C., thus resulting in the microcapsules becoming coated with the copolymer. The slurry is then maintained at a temperature of over 30° C., and to 100 parts by weight of the slurry is added about 20 parts by weight polyvinyl alcohol (binder material, available from Air Products and Chemicals Inc., Allentown, Pa.). The solution thus formed is then coated onto onto Xerox ® 4024 paper by a roll coating technique, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE X

A xerographic carbonless paper with reversibly strengthened microcapsules is prepared by mixing together about 100 parts by weight of a Solvent Oil with dissolved Color Former, consisting of an alkyl biphenyl solvent oil (Sure Sol-290, available from Koch Chemical Co., Corpus Christi, Tex.), containing 3% by weight of dissolved color former (Crystal Violet Lactone, available from Nachem Inc., Braintree, Mass.), about 10 parts by weight of n-butyl methacrylate, about 2 parts by weight of 2,2'-azobisisobutyronitrile (polymerization initiator, available from Polysciences, Inc.), Warrington, PA, an O-acyloxime crosslinking moiety incorporated into a bisacrylate monomer as shown in *J. Imaging Science*, Vol. 34, No. 6, 259-264 (1990) and *Europ. Polym. J.*, Vol. 6, 933 (1970) in an amount of about 5 percent by weight of the n-butylmethacrylate, and n-dodecyl mercaptan (chain transfer agent, available from Aldrich, Milwaukee, Wis.) in an amount of about 0.1 percent by weight of the n-butylmethacrylate. Microcapsules are prepared as described in U.S. Pat. No. 4,663,266, wherein the microcapsule walls are gelatin. Upon formation of the capsule shells, the capsules are heated to a temperature of from about 65° to about 80° C. for a period of about 4 hours to complete formation of a methacrylate gel within the capsule cores, resulting in microcapsules internally reinforced with a butyl methacrylate polymer gel.

To 80 parts by weight of a slurry containing about 30 percent by weight of the internally reinforced microcapsules thus formed and about 70 percent by weight water is added 20 parts by weight of a solution containing 98 percent by weight water and 2 percent by weight of a copolymer of N-isopropylacrylamide (90 mole percent) and methyl vinyl ketone (10 mole percent) (prepared as described in *J. Polymer. Sci.*, Vol. 25, 403 (1957), wherein the free radical initiator system is the redox catalyst ammonium persulfate-sodium bisulfite in water at room temperature). The temperature of the slurry is then increased slowly to over 30° C., which is the precipitation temperature of the copolymer, and less than about 40° C., thus resulting in the microcapsules becoming coated with the copolymer. The slurry is then maintained at a temperature of over 30° C., and to 100 parts by weight of the slurry is added about 20 parts by weight polyvinyl alcohol (binder material, available from Air Products and Chemicals Inc., Allentown, Pa.), and about 30 parts by weight of spacer particles (typically about 15 to about 20 microns in average particle diameter, consisting of thermo-resistant calibrated wheat starch, available from Amylum, N.V., Aalst, Belgium). The solution thus formed is then coated onto onto Xerox ® 4024 paper by a reverse gravure coating technique, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

EXAMPLE XI

A xerographic carbonless paper with reversibly strengthened microcapsules is prepared by mixing together about 100 parts by weight of a Solvent Oil with dissolved Color Former, consisting of an alkyl biphenyl solvent oil (Sure Sol-290, available from Koch Chemical Co., Corpus Christi, Tex.), containing 3% by weight of dissolved color former (Crystal Violet Lactone, available from Nachem Inc., Braintree, Mass.), about 10 parts by weight of n-butyl methacrylate, about 2 parts by weight of 2,2'-azobisisobutyronitrile (polymerization initiator, available from Polysciences, Inc., Warrington, PA), an O-acyloxime crosslinking moiety incorporated into a bisacrylate monomer as shown in *J. Imaging Science*, Vol. 34, No. 6,259-264 (1990) and *Europ. Polym. J.*, Vol. 6,933 (1970) in an amount of about 5 percent by weight of the n-butylmethacrylate, and ndodecyl mercaptan (chain transfer agent, available from Aldrich, Milwaukee, Wis.) in an amount of about 0.1 percent by weight of the n-butylmethacrylate. Microcapsules are prepared as described in U.S. Pat. No. 4,663,266, wherein the microcapsule walls are urea-resorcinolformaldehyde. Upon formation of the capsule shells, the capsules are heated to a temperature of from about 65° to about 80° C. for a period of about 4 hours to complete formation of a methacrylate gel within the capsule cores, resulting in microcapsules internally reinforced with a butyl methacrylate polymer gel.

To 80 parts by weight of a slurry containing about 30 percent by weight of the internally reinforced microcapsules thus formed and about 70 percent by weight water is added 20 parts by weight of a solution containing 98 percent by weight water and 2 percent by weight of a copolymer of N-isopropylacrylamide (90 mole percent) and methyl vinyl ketone (10 mole percent) (prepared as described in *J. Polymer. Sci.*, Vol. 25, 403 (1957), wherein the free radical initiator system is the redox catalyst ammonium persulfate-sodium bisulfite in water at room temperature). The slurry is then incorporated into an Aeromatic Fluid Bed Laboratory Unit STREA-1 (Available from Aeromatic, Inc.), thus resulting in the microcapsules becoming coated with the copolymer. Subsequently, a coating solution is prepared wherein the solids content comprises about 100 parts by weight of the coated microcapsules (typically about 3 to about 10 microns in average particle diameter), and about 30 percent by weight corn starch, a binder material available from Cargill Inc., Cedar Rapids, Iowa. The solid components of the coating material are mixed together in water so that the resulting solution contains about 30 percent by weight solids. The solution thus formed is then coated onto onto Xerox ® 4024 paper by a reverse gravure coating technique, resulting in a total dry coating weight of about 5 grams per square meter, wherein the color former microcapsules are present in an amount of about 3 grams per square meter.

The paper thus formed is then collated with a mating carbonless sheet coated with a color developer and the paper stack is incorporated into a xerographic imaging apparatus. A latent image is formed on the imaging member and developed with a toner, and the developed image is transferred to and fused to the carbonless sheets in the stack. It is believed that the paper stack will pass through the xerographic imaging apparatus without resulting in any machine contamination problems as a result of premature rupture of the color former microcapsules on the paper and without forming smudges on the paper as a result of pressure applied to the paper stack during the imaging process.

Subsequent to affixing the image to the paper sheets, the sheet coated with the color former microcapsules is exposed to ultraviolet light at a wavelength of from about 280 nanometers for a period sufficient to expose the paper to energy of over about 100 milliJoules per square centimeter. After exposure to radiation, it is believed that images can be formed on the papers in the stack by any imaging method entailing the use of pressure, such as a typewriter or a writing pen.

Other embodiments and modifications of the present invention may occur to those skilled in the art subsequent to a review of the information presented herein; these embodiments and modifications, as well as equivalents thereof, are also included within the scope of this invention.

What is claimed is:

1. A process which comprises incorporating into an electrostatic imaging apparatus a recording sheet comprising a support on one surface of which are situated microcapsules which comprise a shell and a core containing a color former and an oil, said microcapsules being strengthened with a polymer capable of degrading upon exposure to actinic radiation; generating an electrostatic latent image on an imaging member in the apparatus; developing the latent image with a developer; transferring the developed image to the recording sheet; and, subsequent to transfer, exposing the recording sheet to actinic radiation at a wavelength at which the polymer will degrade, thereby rendering the microcapsules subject to rupture upon application of pressure.

2. A process according to claim 1 wherein the polymer is selected from the group consisting of homopolymers of methyl vinyl ketone, homopolymers of methyl isopropenyl ketone, copolymers of methyl vinyl ketone and a second monomer, copolymers of methyl isopropenyl ketone and a second monomer, copolymers of polyethylene and carbon monoxide, and mixtures thereof.

3. A process according to claim 2 wherein the second monomer is selected from the group consisting of styrene, acrylates, alkylacrylates, N-isopropylacrylamide, and mixtures thereof.

4. A process according to claim 1 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

5. A process according to claim 1 wherein the recording sheet is exposed to actinic radiation at an intensity of from about 1 to about 500 milliJoules per square centimeter.

6. A process according to claim 1 wherein the recording sheet is exposed to actinic radiation at a wavelength of from about 250 to about 350 nanometers.

7. A process according to claim 1 also including the step of forming a second latent image on the imaging member, developing the second latent image, transferring the developed image to a second sheet comprising a base paper, and placing the recording sheet and the second sheet in contact with each other so that the microcapsules are in contact with the second sheet to form a carbonless paper set, wherein a color developer is contained either on the surface of the recording sheet bearing microcapsules or on the surface of the second sheet in contact with the microcapsules of the recording sheet.

8. A process according to claim 1 wherein the microcapsules comprise a core containing a color former and an oil, a first shell, and on the surface of the first shell a second shell comprising a polymer capable of degrading upon exposure to actinic radiation.

9. A process according to claim 8 wherein the second shell has a thickness of from about 0.01 to about 0.5 microns.

10. A process according to claim 8 wherein the polymer is selected from the group consisting of homopolymers of methyl vinyl ketone, homopolymers of methyl isopropenyl ketone, copolymers of methyl vinyl ketone and a second monomer, copolymers of methyl isopropenyl ketone and a second monomer, copolymers of polyethylene and carbon monoxide, and mixtures thereof.

11. A process according to claim 10 wherein the second monomer is selected from the group consisting of styrene, acrylates, alkylacrylates, N-isopropylacrylamide, and mixtures thereof.

12. A process according to claim 8 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

13. A process according to claim 1 wherein the microcapsules comprise a shell comprising a polymer capable of degrading upon exposure to actinic radiation and a core containing a color former and an oil.

14. A process according to claim 13 wherein the polymer is selected from the group consisting of homopolymers of methyl vinyl ketone, homopolymers of methyl isopropenyl ketone, copolymers of methyl vinyl ketone and a second monomer, copolymers of methyl isopropenyl ketone and a second monomer, copolymers of polyethylene and carbon monoxide, and mixtures thereof.

15. A process according to claim 14 wherein the second monomer is selected from the group consisting of styrene, acrylates, alkylacrylates, N-isopropylacrylamide, and mixtures thereof.

16. A process according to claim 12 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

17. A process according to claim 1 wherein the microcapsules comprise a shell and a core containing a color former, an oil, and a polymer capable of degrading upon exposure to actinic radiation.

18. A process according to claim 17 wherein the polymer is selected from the group consisting of homopolymers of methyl vinyl ketone, homopolymers of methyl isopropenyl ketone, copolymers of methyl vinyl ketone and a second monomers, copolymers of methyl isopropenyl ketone and a second monomer, copolymers of polyethylene and carbon monoxide, and mixtures thereof.

19. A process according to claim 18 wherein the second monomer is selected from the group consisting of styrene, acrylates, alkylacrylates, N-isopropylacrylamide, and mixtures thereof.

20. A process according to claim 17 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

21. A process according to claim 17 wherein the polymer is present in the core in an amount of from about 1 to about 30 percent by weight of the core material.

22. A process according to claim 1 wherein the surface of the recording sheet bearing the microcapsules is overcoated with a polymer capable of degrading upon exposure to actinic radiation, wherein the polymer is impermeable with respect to the oil prior to degradation and permeable with respect to the oil subsequent to degradation.

23. A process according to claim 22 wherein the polymer is selected from the group consisting of homopolymers of methyl vinyl ketone, homopolymers of methyl isopropenyl ketone, copolymers of methyl vinyl ketone and a second monomer, copolymers of methyl isopropenyl ketone and a second monomer, copolymers of polyethylene and carbon monoxide, and mixtures thereof.

24. A process according to claim 23 wherein the second monomer is selected from the group consisting of styrene, acrylates, alkylacrylates, N-isopropylacrylamide, and mixtures thereof.

25. A process according to claim 23 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

26. A process according to claim 23 wherein the polymer overcoat has a thickness of from about 0.01 to about 0.5 microns.

27. A recording sheet comprising a support on one surface of which are situated microcapsules which comprise a core containing a color former and an oil, a first shell, and on the surface of the first shell a second shell comprising a polymer capable of degrading upon exposure to actinic radiation.

28. A recording sheet according to claim 27 wherein the second shell has a thickness of from about 0.01 to about 0.5 microns.

29. A recording sheet according to claim 27 wherein the polymer is selected from the group consisting of homopolymers of methyl vinyl ketone, homopolymers of methyl isopropenyl ketone, copolymers of methyl vinyl ketone and a second monomer, copolymers of methyl isopropenyl ketone and a second monomer, copolymers of polyethylene and carbon monoxide, and mixtures thereof.

30. A recording sheet according to claim 29 wherein the second monomer is selected from the group consisting of styrene, acrylates, alkylacrylates, N-isopropylacrylamide, and mixtures thereof.

31. A recording sheet according to claim 27 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

32. A carbonless paper set which comprises a first recording sheet according to claim 27 and a second recording sheet comprising a paper support, wherein a color developer is contained either on the surface of the first recording sheet bearing the microcapsules or on at least one surface of the second recording sheet.

33. A carbonless paper set according to claim 32 which also comprises at least one intermediate sheet of paper containing on at least one surface a color developer and containing on at least one surface microcapsules which comprise a core containing a color former and an oil, a first shell, and on the surface of the first shell a second shell comprising a polymer capable of degrading upon exposure to actinic radiation.

34. A recording sheet comprising a support on one surface of which are situated microcapsules which comprise a shell and a core containing a color former and an oil, wherein the surface of the recording sheet bearing the microcapsules is overcoated with a polymer capable of degrading upon exposure to actinic radiation, wherein the polymer is impermeable with respect to the oil prior to degradation and permeable with respect to the oil subsequent to degradation.

35. A recording sheet according to claim 34 wherein the overcoating has a thickness of from about 0.01 to about 0.5 microns.

36. A recording sheet according to claim 34 wherein the polymer is selected from the group consisting of homopolymers of methyl vinyl ketone, homopolymers of methyl isopropenyl ketone, copolymers of methyl vinyl ketone and a second monomer, copolymers of methyl isopropenyl ketone and a second monomer, copolymers of polyethylene and carbon monoxide, and mixtures thereof.

37. A recording sheet according to claim 36 wherein the second monomer is selected from the group consisting of styrene, acrylates, alkylacrylates, N-isopropylacrylamide, and mixtures thereof.

38. A recording sheet according to claim 34 wherein the polymer is selected from the group consisting of copolymers of N-isopropylacrylamide and methyl vinyl ketone, homopolymers of alkylmethacrylate crosslinked with O-acyloxime, copolymers of alkylmethacrylate and a second monomer crosslinked with O-acyloxime, and mixtures thereof.

39. A carbonless paper set which comprises a first recording sheet according to claim 34 and a second recording sheet comprising a paper support, wherein a color developer is contained either on the surface of the first recording sheet bearing the microcapsules or on at least one surface of the second recording sheet.

40. A carbonless paper set according to claim 39 which also comprises at least one intermediate sheet of paper containing on at least one surface a color developer and containing on at least one surface microcapsules which comprise a shell and a core containing a color former and an oil, wherein the surface of the intermediate sheet bearing the microcapsules is overcoated with a polymer capable of degrading upon exposure to actinic radiation, wherein the polymer is impermeable with respect to the oil prior to degradation and permeable with respect to the oil subsequent to degradation.

* * * * *